(12) United States Patent
Firth (10) Patent No.: US 9,509,118 B2
(45) Date of Patent: Nov. 29, 2016

(54) OPTOELECTRONIC ASSEMBLY

(71) Applicant: Oclaro Technology Limited, Northamptonshire (GB)

(72) Inventor: Paul Firth, Devon (GB)

(73) Assignee: Oclaro Technology Limited, Northamptonshire (GB)

( * ) Notice: Subject to any disclaimer, the term of this patent is extended or adjusted under 35 U.S.C. 154(b) by 0 days.

(21) Appl. No.: 14/433,452

(22) PCT Filed: Sep. 27, 2013

(86) PCT No.: PCT/EP2013/070293
§ 371 (c)(1),
(2) Date: Apr. 3, 2015

(87) PCT Pub. No.: WO2014/056745
PCT Pub. Date: Apr. 17, 2014

(65) Prior Publication Data
US 2015/0263483 A1  Sep. 17, 2015

(30) Foreign Application Priority Data

Oct. 9, 2012 (GB) .................................. 1218066.7

(51) Int. Cl.
*H01S 3/04* (2006.01)
*H01S 5/024* (2006.01)
*H01S 5/022* (2006.01)

(52) U.S. Cl.
CPC ........... *H01S 5/02415* (2013.01); *H01S 5/024* (2013.01); *H01S 5/0226* (2013.01);
(Continued)

(58) Field of Classification Search
CPC ........... H01S 5/02216; H01S 5/02276; H01S 5/02415; H01S 5/024; H01S 5/02476; H01S 5/02288; H01S 5/0226; H01S 5/02236

USPC .................................. 372/34, 36, 43.01
See application file for complete search history.

(56) References Cited

U.S. PATENT DOCUMENTS 4,989,930 A * 2/1991 Nakagawa ........... G02B 6/4204
257/664
2002/0044578 A1    4/2002 Iizuka et al.
(Continued)

FOREIGN PATENT DOCUMENTS

| CN | 201732811 U | 2/2011 |
| JP | 59-196272 A | 11/1984 |
| JP | H02 197185 A | 8/1990 |

(Continued)

OTHER PUBLICATIONS

Intellectual Property Office of the United Kingdom, Patents Act 1977: Search Report under Section 17(5), United Kingdom Patent Application No. GB1218066.7, Jan. 30, 2013, 5 Pages.
(Continued)

*Primary Examiner* — Kinam Park
(74) *Attorney, Agent, or Firm* — Fenwick & West LLP (57) ABSTRACT

The invention relates to an optoelectronic assembly. The optoelectronic assembly comprises one or more optoelectronic components and a housing. The housing comprises an outer wall electrically connected to the one or more optoelectronic elements. The housing is configured to provide an electrical interface between the one or more optoelectronic components and an external electronic device. The electrical connection between the outer wall and the one or more optoelectronic components comprises an electrically conductive element. The electrically conductive element is supported on a dielectric material, such that the dielectric material provides structural support to the electrically conductive element between the one or more optoelectronic components and the outer wall.

17 Claims, 5 Drawing Sheets

(52) U.S. Cl.
CPC ....... *H01S5/02216* (2013.01); *H01S 5/02236* (2013.01); *H01S 5/02276* (2013.01); *H01S 5/02288* (2013.01); *H01S 5/02476* (2013.01); *H01L 2224/48453* (2013.01)

(56) References Cited

U.S. PATENT DOCUMENTS

| | | | |
|---|---|---|---|
| 2003/0001081 A1* | 1/2003 | Kaneko | H01S 5/02276 250/216 |
| 2004/0264882 A1 | 12/2004 | Torigoe et al. | |
| 2012/0267674 A1* | 10/2012 | Watari | H01L 23/13 257/99 |

FOREIGN PATENT DOCUMENTS

| | | |
|---|---|---|
| JP | H10 223988 A | 8/1998 |
| JP | 2001-68778 A | 3/2001 |
| JP | 2011-146480 A | 7/2011 |
| WO | WO 2011/037185 A1 | 3/2011 |

OTHER PUBLICATIONS

Patent Cooperation Treaty, International Search Report and Written Opinion of the International Searching Authority, International Patent Application No. PCT/EP2013/070293, Feb. 25, 2014, 12 Pages.

* cited by examiner

OPTOELECTRONIC ASSEMBLY

TECHNICAL FIELD

The invention relates to an optoelectronic assembly. Specifically, the invention relates to an optoelectronic assembly providing low thermal conductivity between one or more optoelectronic components and an outer wall of a housing.

BACKGROUND

In optical networks, it is desirable to keep optoelectronic components of optoelectronic devices within the network at a stable temperature. Typically, the stable temperature required is lower than the temperature of the environment external to the optoelectronic device, such that the optoelectronic components are required to be cooled.

For example, high power optical network laser packages are commonly placed in racks at high density to reduce the amount of space they occupy. This high density arrangement places a large amount of electrical components in close proximity, which increases the temperature in the surrounding area, external to the laser package. Typically, the external temperature may reach 85° C., or more.

In order to maintain correct operation of the optoelectronic components within the laser packages, the temperature of those components should be kept stable and well below 85° C. For this reason, the temperature of the optoelectronic components within the laser package is accurately controlled.

One method of controlling the temperature of the optoelectronic components is by thermoelectric cooling. A thermoelectric cooler (TEC) is placed in thermal communication with the optoelectronic components and draws heat away from them using the Peltier effect. In order to provide this function, the TEC requires electrical power.

SUMMARY

According to the invention in a first aspect, there is provided an optoelectronic assembly. The optoelectronic assembly comprises one or more optoelectronic components and a housing. The housing comprises an outer wall electrically connected to the one or more optoelectronic elements. The housing is configured to provide an electrical interface between the one or more optoelectronic components and an external electronic device. The electrical connection between the outer wall and the one or more optoelectronic components comprises an electrically conductive element. The electrically conductive element is supported on a dielectric material, such that the dielectric material provides structural support to the electrically conductive element between the one or more optoelectronic components and the outer wall.

The thickness of the electrically conductive element may be in the range from 0.1 µm to 0.5 µm. The width of the electrically conductive element may be in the range from 25 µm to 35 µm. The reduced thickness and width leads to a reduced cross sectional area of the conductive element and means that there is less heat transfer along it.

Optionally, the cross sectional area of the electrically conductive element is in the range from $2.5 \times 10^{-12}$ m$^2$ to $1.75 \times 10^{-11}$ m$^2$. This may be provided by an electrically conductive element having any shaped cross section. Exemplary cross sections are rectangular or circular.

Optionally, the dielectric material is flexible. This allows the optoelectronic components to move relative to the outer wall without damaging the electrically conductive element.

Optionally, the dielectric material comprises upper and lower dielectric layers, the conductive element being disposed between the upper and lower dielectric layers. The upper and lower layers may form a single piece of dielectric material in that the dielectric material may laterally surround the electrically conductive element.

Optionally, the thickness of each of the first and second dielectric layers is in the range from 4 µm to 8 µm. If the dielectric material laterally surrounds the electrically conductive element, the thickness of the dielectric material on top of and below the electrically conductive element may be in the range from 4 µm to 8 µm.

Optionally, the thickness of each of the first and second dielectric layers (or the thickness of the dielectric on top of and below the electrically conductive material) is in the range from 13 µm to 17 µm.

Optionally, the width of each of the first and second dielectric layers is in the range from 35 µm to 55 µm.

Optionally, the dielectric material is wider than the electrically conductive element by a distance in the range from 8 µm to 12 µm on each side. If the dielectric material laterally surrounds the electrically conductive element, the thickness of the dielectric material either side of the electrically conductive element may be in the range from 8 µm to 12 µm.

Optionally, the electrically conductive element follows an indirect path on the dielectric material.

Optionally, the electrical connection comprises a plurality of electrically conductive elements, each disposed on the dielectric material.

Optionally, the optoelectronic components are located on a chip, and the chip is located on a chip carrier.

Optionally, the optoelectronic assembly further comprises a heat pump in thermal communication with the one or more optoelectronic components.

Optionally, the heat pump is a thermoelectric cooler.

According to the invention in a second aspect, there is provided a laser package for use in optical communication networks comprising the optoelectronic assembly described above.

According to the invention in a third aspect, there is provided an optoelectronic assembly, comprising one or more optoelectronic components; and a housing comprising an outer wall electrically connected to the one or more optoelectronic elements, wherein the housing is configured to provide an electrical interface between the one or more optoelectronic components and an external electronic device, and wherein the electrical connection between the outer wall and the one or more optoelectronic components comprises an electrically conductive element having a cross sectional area in the range from $2.5 \times 10^{-12}$ m$^2$ to $1.75 \times 10^{-11}$ m$^2$.

According to the invention in a fourth aspect, there is provided an optoelectronic assembly, comprising one or more optoelectronic components; and a housing comprising an outer wall electrically connected to the one or more optoelectronic elements, wherein the housing is configured to provide an electrical interface between the one or more optoelectronic components and an external electronic device, and wherein the electrical connection between the outer wall and the one or more optoelectronic components comprises an electrically conductive element having a first thermal conductivity supported on a material having a second thermal conductivity lower than the first thermal conductivity.

BRIEF DESCRIPTION OF THE DRAWINGS

Exemplary embodiments of the invention will now be described with reference to the accompanying drawings, in which.

DESCRIPTION

Generally, disclosed herein is an optoelectronic assembly in which an electrical connection between optoelectronic components and an outer wall of a housing is configured to provide a low thermal conductivity path.

The inventors have appreciated that an electrical connection between optoelectronic components and a housing of an optoelectronic assembly provides a heat transfer path from the relatively high temperature housing to the relatively low temperature optoelectronic components. Further, the inventors have appreciated that the efficiency of an optoelectronic assembly may be improved if the amount of heat transferred along the heat transfer path is reduced.

For example, and referring to the laser package discussed above, the optoelectronic components and the TEC are typically housed within a package housing. The housing provides an optical and electrical interface between the optoelectronic components and any external electronic devices. It is therefore necessary to provide an electrical connection from the optoelectronic components to the housing. The outer wall of the housing is subject to the relatively high temperature of the external environment. Therefore, the electrical connection between the outer wall and the optoelectronic components provides a heat transfer path and the optoelectronic components are heated as a result. The TEC is therefore required to work harder to cool the optoelectronic components, decreasing the efficiency of the laser package.

In extreme circumstances, the increased workload of the TEC may generate more heat, contributing to positive thermal feedback and leading to thermal runaway.

Figure 1:
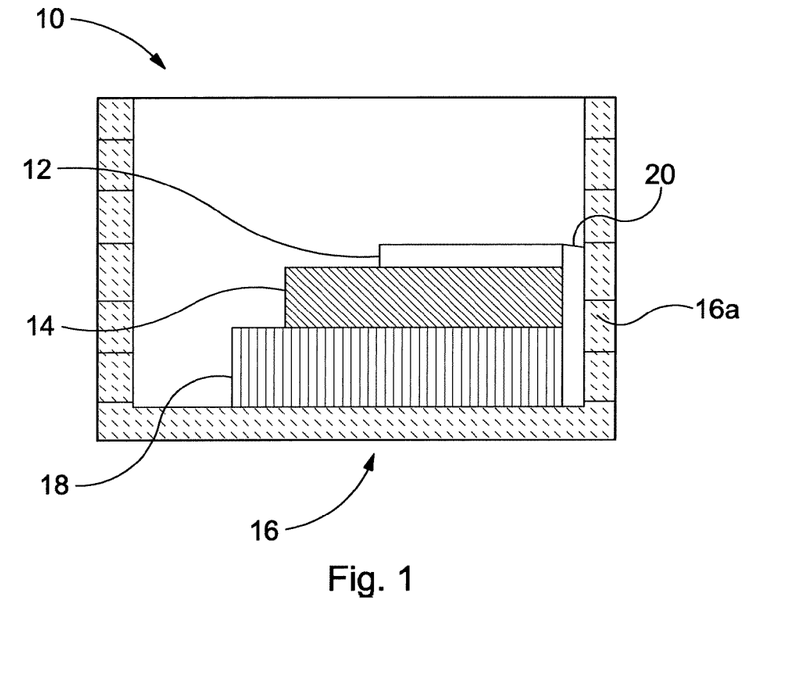
FIG. 1 is a simplified schematic representation of a cross section through an optoelectronic assembly.

FIG. 1 shows a schematic section through an optoelectronic assembly 10. The assembly 10 includes an electronic device such as a chip 12 (for example a laser diode) mounted on a carrier 14 in a housing 16. The chip 12 is connected to an output optical fibre (not shown). A Thermoelectric Cooler (TEC) 18 is connected to the carrier 14, and to a heat sink mounted on or integral with the casing 16, to transfer heat from the (relatively cool) carrier 14 to the (relatively hot) casing 16.

In exemplary optical assemblies, the housing is manufactured from a ceramic, such as aluminium nitride (AlN). An outer wall 16a of the housing 16 comprises a laminate structure of a plurality of AlN sections stacked on top of each other. In practical implementations of exemplary optical assemblies, each of the outer walls of the housing 16 may comprise the laminate structure. The laminate structure of the outer wall 16a allows electrically conductive tracks to be routed laterally along the length of the outer wall 16a. The tracks are connected to input and output ports of the assembly 10, which are located on the outer walls of the housing. These input and output ports provide an interface between the chip 12 and any external electronic devices required for proper operation of the assembly 10, via the electrically conductive tracks located between the AlN layers of the laminated outer wall 16a.

An electrical connection 20 is provided between the chip 12 and the outer wall 16a to electrically connect the chip 12 to the input and output ports via the electrically conductive tracks.

The chip 12 comprises a plurality of electronic and optoelectronic components. In particular, the chip 12 may be a high power laser diode configured to output light at a 1550 nm wavelength. Typically, light output from the laser diode is transmitted on separate channels having a channel spacing of, say, 50 GHz. In order to maintain the accuracy of the wavelength of light output from the laser diode, a wavelength reference component is used. The wavelength reference may be a Fabry-Perot interferometer or etalon. The output of the wavelength reference is temperature dependent and it is therefore important to maintain the reference at a desired stable operating temperature.

As stated above, housing 16 is exposed to the external environment, which is at a high temperature relative to a desired operating temperature of the chip 12. Typically, the external temperature can reach 85° C. or more, and the desired operating temperature of the chip 12 may be approximately 25° C.

The TEC 18 operates to reduce the temperature of the carrier 14 and, therefore, the chip 12. A feedback loop is commonly used to operate the TEC 18 to maintain the temperature of the carrier 14 and the chip 12 at the desired operating temperature. As the TEC uses electrical power to draw heat away from the carrier 14 and the chip 12, the higher the temperature of the chip 12, the more electrical power is required by the TEC 18 to cool it.

Figure 2:
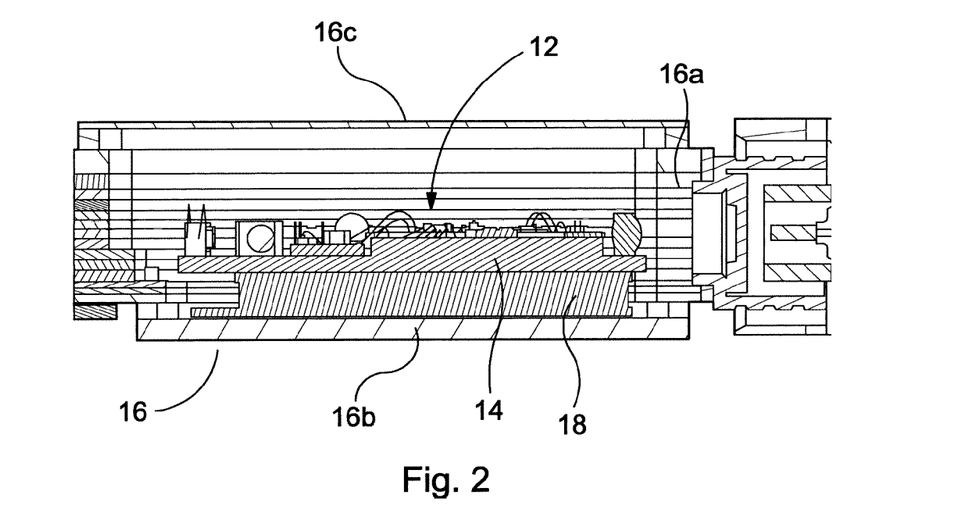
FIG. 2 is a cross section through a laser package.

FIG. 2 shows a more detailed section through an optoelectronic assembly included in a high power laser package suitable for use in optical networks. The housing 16 comprises outer walls 16a, a base 16b and a cover 16c. The laminate structure of the outer walls 16a can be clearly seen in FIG. 2 to run around the circumference of the housing. The electrically conductive tracks (not shown) are located between the layers of the laminated outer walls 16a to provide an electrical connection around the outer walls 16a.

The TEC 18 is positioned on the base 16b. Located on top of the TEC is the carrier 14. Located on the carrier 14 is the chip 12. FIG. 2 shows typical optoelectronic and electronic components located on the chip 12.

Figure 3:
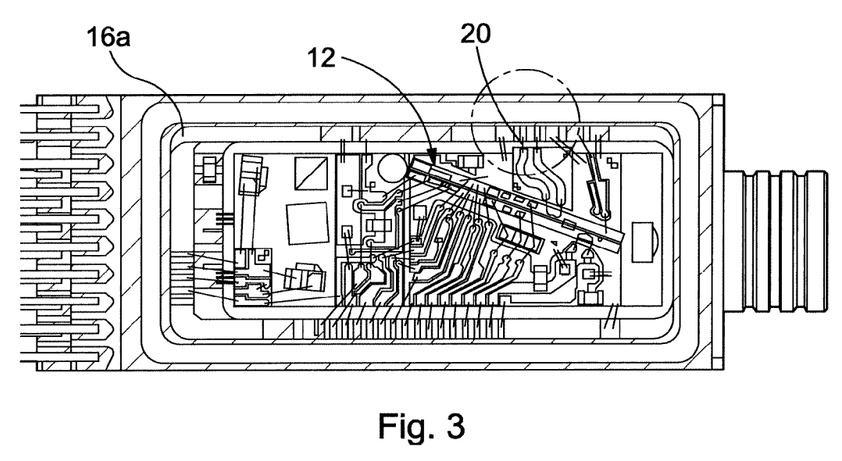
FIG. 3 is a plan view of optoelectronic components arranged in a housing.

FIG. 3 shows a plan view of the optoelectronic assembly 10 with the cover 16c removed to expose the chip 12. The outer walls 16a of the package are connected to various components on the chip 12 by electrical connections 20. An exemplary electrical connection 20 is shown in the dashed circled region of FIG. 2.

The inventors have appreciated that a significant heat transfer path between the housing 16 and the chip 12 is provided by the electrical connection 20. Typically, in known optoelectronic assemblies, an electrical connection comprises eight parallel 25 pm diameter wire bonds. The wire bonds are typically manufactured from gold or aluminium, which, in addition to being good electrical conductors, are also good thermal conductors. The temperature of the chip 12 is therefore raised by heat flowing from the relatively high temperature housing 16 to the relatively low temperature chip 12. Eight parallel wire bonds are used as it is desirable to provide a low inductance coupling between the chip 12 and the housing 16.

In exemplary optoelectronic assemblies disclosed herein, the electrical connection 20 is provided by an electrically conductive element on a dielectric substrate. The use of a dielectric substrate allows a thinner electrical connection to be used while mitigating the risk that the conductor will break. The dielectric substrate therefore provides a structural support for the electrically conductive element.

Figure 4:
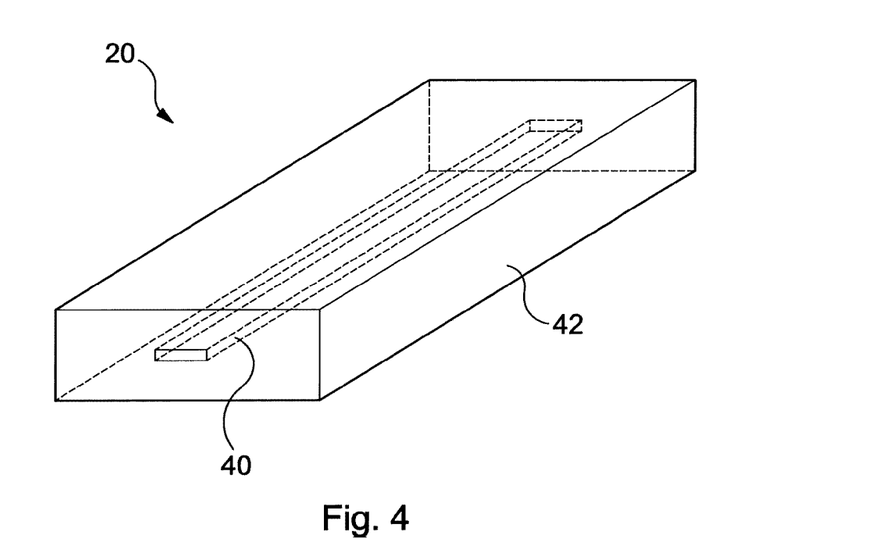
FIG. 4 is a schematic isometric representation of an electrical connection.
Figure 5:
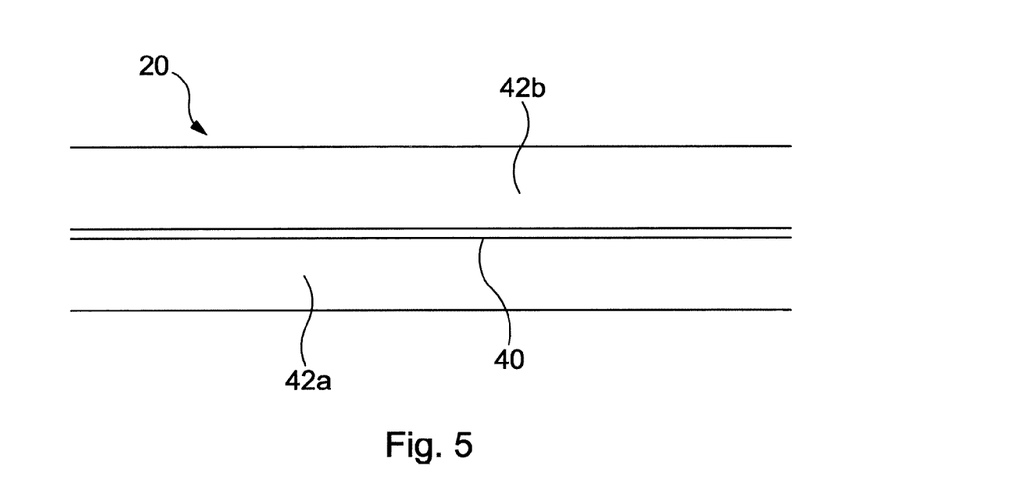
FIG. 5 is a schematic cross section through an electrical connection.

FIG. 4 shows a schematic perspective view of an exemplary electrical connection 20. The electrical connection 20 comprises an electrically conductive element 40 set within a dielectric substrate 42. FIG. 5 shows a section through the electrical connection 20. As shown in FIG. 5, the electrical connection 20 comprises three layers: a first layer of dielectric 42a; a layer of electrically conductive material 40 supported on the first layer of dielectric 42a; and a second layer of dielectric 42b positioned over the electrically conductive material 40 so as to cover it.

In exemplary electrical connections 20, the first and/or second dielectric layers 42a, 42b may be polyimide material. The electrically conductive element may comprise gold, aluminium or copper.

It is advantageous for the first and second dielectric layers 42a, 42b to be flexible, as this allows relative movement between the chip 12 and the housing 16 with a reduced risk of the electrical connection 20 breaking or fracturing. As the TEC 18 operates, it may move up and down within the housing 16. As the chip 12 and carrier 14 are positioned on top of the TEC 18, this leads to relative movement between the chip 12 and the housing 16, which places strain on the electrical connection 20. If the first and second dielectric layers 42a, 42b are flexible, much of the strain induced by the movement of the chip 12 within the housing 16 may be absorbed by the flexibility in the electrical connection 20.

The electrically conductive element 40 of the electrical connection 20 provides a high bandwidth connection with a low cross sectional area. The high bandwidth connection may be in the range from 15 GHz to 25 GHz, and, specifically, may be 20 GHz. The low cross sectional area reduces the amount of heat transferred via the electrically conductive element 40. In exemplary electrical connections 20, the electrically conductive element 40 may have a thickness in the range from 0.1 µm to 0.5 µm. In a particular exemplary electrical connection 20, the thickness of the electrically conductive element 40 may be 0.3 µm. In other exemplary electrical connections, the thickness of the conductive element may be less than 0.3 µm. The electrically conductive element 40 may have a width in the range from 25 µm to 35 µm, in particular, the width of the electrically conductive element may be 30 µm.

The thickness of each of the first and second dielectric layers 42a, 42b may be in the range from 4 µm to 20 µm. In particular exemplary electrical connections 20, the thickness of each of the first and second dielectric layers 42a, 42b may be in the range from 4 µm to 8 µm, or from 13 µm to 17 µm. In further particular exemplary electrical connections 20, the thickness of each of the first and second dielectric layers 42a, 42b may be 6 µm or 15 µm.

The width of each of the first and second dielectric layers 42a, 42b may be in the range from 35 µm to 55 µm. In particular exemplary electrical connections 20, the width of the first and second dielectric layers 42a, 42b may be 50 µm. In exemplary assembled electrical connections 20, the first and second dielectric layers 42a, 42b may be wider than the electrically conductive element 40 by a distance in the range from 8 µm to 12 µm on each side.

Exemplary electrically conductive elements are arranged as transmission lines and so may have any length suitable for the optoelectronic assembly. In exemplary electrically conductive elements comprising a wire bond, the inductance of the wire bond is per unit length and the length. Therefore, the longer the wire bond, the less the bandwidth of the bond. The length of such electrically conductive elements is therefore limited according to bandwidth restrictions.

Typically, a device operating at around 10 Gb/s may require a distance of 0.3 mm or less between the housing and the chip. When using the electrically conductive element disclosed herein, the distance between the housing and the chip may be extended to distances greater than 0.3 mm. In particular devices, the distance between the housing and the chip may be 0.5 mm or greater, or 1 mm or greater. This increases thermal isolation between the housing and the chip and requires less accurate parts, as the larger gap could absorb a greater tolerance in relation to the chip package and/or the housing.

Figure 6:
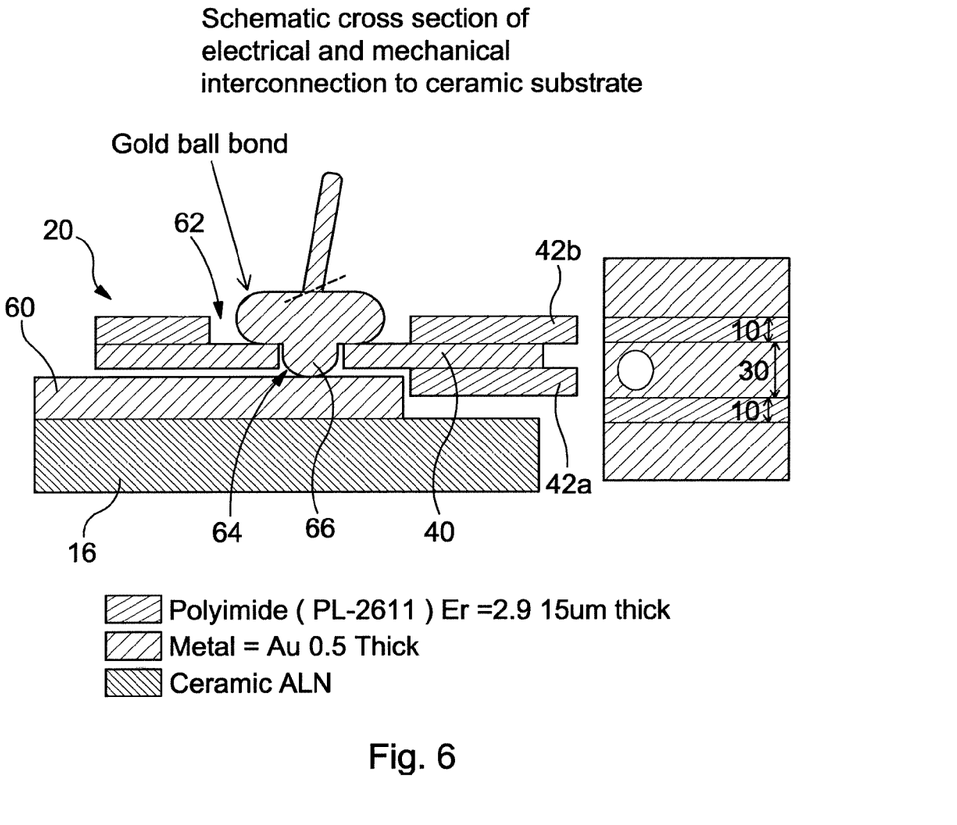
FIG. 6 is a schematic section through an electrical connection bonded to a bond pad.

The electrical connection 20 may be connected to gold bond pads on each of the housing 16 and the chip 12 to provide electrical interconnection therebetween. FIG. 6 shows an exemplary method for connecting the electrical connection 20 to gold bond pads 60 formed between the layers of the laminated outer walls 16a of the housing 16.

At one end of the electrical connection 20 the first dielectric layer 42a is removed to expose a lower face of the electrically conductive element 40. A first via 62 is formed in the second dielectric layer 42b to expose an upper face of the electrically conductive element 40. A second via 64, smaller than and concentric with the first via 62, is formed in the electrically conductive element 40. A gold bond ball 66 is then placed over the second via 64 and a pressure is applied to the gold bond ball 66 to force it through the second via 64. The gold bond ball 66 is thereby misshapen such that flattened edges contact the upper surface of the electrically conductive element 40 and a portion of the gold bond ball 66 forced through the second via 64 contacts the gold bond pad 60

Figure 7:
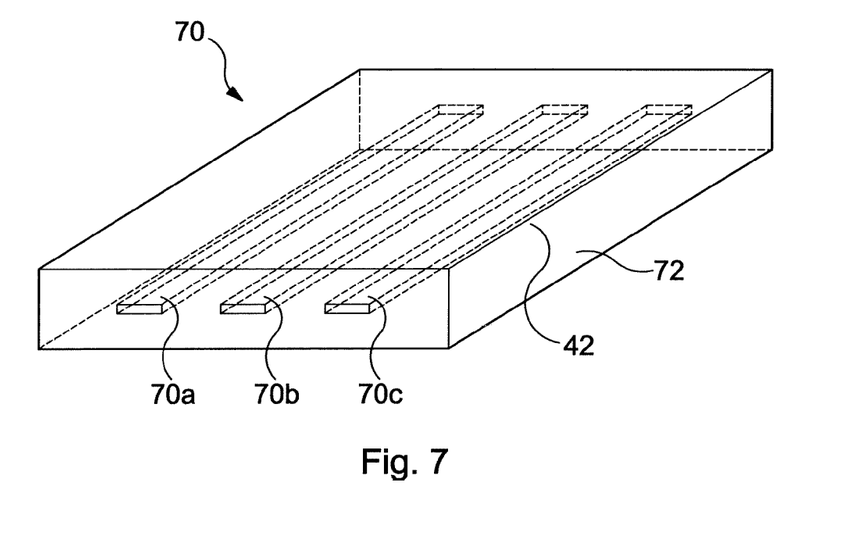
FIG. 7 is a schematic isometric representation of an electrical connection.
Figure 8:
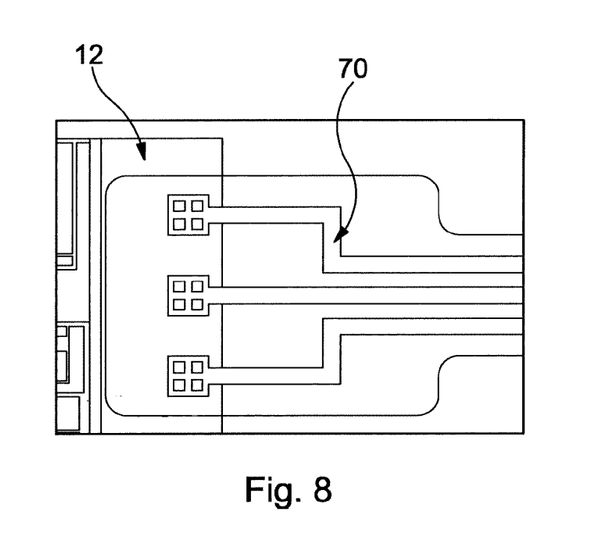
FIG. 8 is a schematic representation of an electrical connection between a chip and an outer wall of a housing.

FIG. 7 shows a further exemplary electrical connection 70 comprising a plurality of electrically conductive elements 72a-c retained in a dielectric material 72. The electrical connection 70 may be used to provide a plurality of electrical connections between the chip 12 and the housing (not shown) in a strip, as shown in FIG. 8. In FIG. 8, the plurality of electrically conductive elements 72a-72c diverge such that they are spaced to correspond to electrical connection points on the chip 12.

FIG. 7 shows only three electrically conductive elements 70a-c but other numbers of electrically conductive elements may also be used. Additionally, FIGS. 4 and 7 show straight electrically conductive elements 40, 70a-c. However, any design of electrically conductive element may be used. For example, the electrically conductive elements may be designed to take a curved or angled path as required. Further, the electrically conductive elements may comprise a number of direction changes.

It is noted that, although FIGS. 4 and 7 show electrically conductive elements 40, 70a-c surrounded by dielectric material 42, 72, exemplary electrical connectors may comprise an electrically conductive element supported on a single layer of dielectric material.

Further, it is noted that, although the exemplary electrically conductive elements described above have a rectangular cross section, electrically conductive elements may have other cross sections without departing from the scope of the appended claims. For example, electrically conductive elements may have a circular cross section.

Other embodiments may be envisaged by the skilled person without departing from the scope of the appended claims.

The invention claimed is:

1. An optoelectronic assembly, comprising:
one or more optoelectronic components; and
a housing comprising an outer wall electrically connected to the one or more optoelectronic elements, wherein the housing is configured to provide an electrical interface between the one or more optoelectronic components and an external electronic device,
wherein the electrical connection between the outer wall and the one or more optoelectronic components comprises an electrically conductive element supported on a dielectric material, such that the dielectric material provides structural support to the electrically conductive element between the one or more optoelectronic components and the outer wall,
and wherein the dielectric material is flexible such that relative movement between the one or more optoelectronic components and the housing is possible.

2. The optoelectronic assembly of claim 1, wherein the electrically conductive element has a thickness in the range from 0.1 μm to 0.5 μm.

3. The optoelectronic assembly of claim 1, wherein the electrically conductive element has a width in the range from 25 μm to 35 μm.

4. The optoelectronic assembly of claim 1, wherein the cross sectional area of the electrically conductive element is in the range from $2.5 \times 10^{-12}$ m$^2$ to $1.75 \times 10^{x11}$ m$^2$.

5. The optoelectronic assembly of claim 1, wherein the dielectric material comprises upper and lower dielectric layers, the conductive element being disposed between the upper and lower dielectric layers.

6. The optoelectronic assembly of claim 5, wherein the thickness of each of the first and second dielectric layers is in the range from 4 μm to 8 μm.

7. The optoelectronic assembly of claim 5, wherein the thickness of each of the first and second dielectric layers is in the range from 13 μm to 17 μm.

8. The optoelectronic assembly of claim 5, wherein the width of each of the first and second dielectric layers is in the range from 35 μm to 55 μm.

9. The optoelectronic assembly of claim 1, wherein the dielectric material is wider than the electrically conductive element by a distance in the range from 8 μm to 12 μm on each side.

10. The optoelectronic assembly of claim 1, wherein the electrically conductive element follows an indirect path on the dielectric material.

11. The optoelectronic assembly of claim 1, wherein the electrical connection comprises a plurality of electrically conductive elements, each disposed on the dielectric material.

12. The optoelectronic assembly of claim 1, wherein the optoelectronic components are located on a chip, and wherein the chip is located on a chip carrier.

13. The optoelectronic assembly of claim 1, further comprising a heat pump in thermal communication with the one or more optoelectronic components.

14. The optoelectronic assembly of claim 13, wherein the heat pump is a thermoelectric cooler.

15. A laser package for use in optical communication networks comprising the optoelectronic assembly of claim 1.

16. An optoelectronic assembly, comprising
one or more optoelectronic components; and
a housing comprising an outer wall electrically connected to the one or more optoelectronic elements, wherein the housing is configured to provide an electrical interface between the one or more optoelectronic components and an external electronic device,
and wherein the electrical connection between the outer wall and the one or more optoelectronic components comprises an electrically conductive element having a cross sectional area in the range from $2.5 \times 10^{-12}$ m$^2$ to $1.75 \times 10^{-11}$ m$^2$.

17. An optoelectronic assembly, comprising
one or more optoelectronic components; and
a housing comprising an outer wall electrically connected to the one or more optoelectronic elements, wherein the housing is configured to provide an electrical interface between the one or more optoelectronic components and an external electronic device,
wherein the electrical connection between the outer wall and the one or more optoelectronic components comprises an electrically conductive element having a first thermal conductivity supported on a flexible material having a second thermal conductivity lower than the first thermal conductivity such that relative movement between the one or more optoelectronic components and the housing is possible.

* * * * *